United States Patent [19]
Pearsall

[11] 4,382,265
[45] May 3, 1983

[54] HETEROJUNCTION SEMICONDUCTOR DEVICE

[75] Inventor: Thomas Pearsall, Paris, France

[73] Assignee: Thomson-CSF, Paris, France

[21] Appl. No.: 115,097

[22] Filed: Jan. 24, 1980

[30] Foreign Application Priority Data

Jan. 26, 1979 [FR] France .................. 79 02098

[51] Int. Cl.³ .................. H01S 3/096; H01L 29/203; H01L 29/205; H01L 33/00
[52] U.S. Cl. .................. 357/16; 148/171; 357/17; 357/61; 372/44
[58] Field of Search .......... 357/16, 61, 17; 372/44

[56] References Cited

U.S. PATENT DOCUMENTS

| | | | |
|---|---|---|---|
| 3,814,993 | 6/1974 | Kennedy | 357/16 |
| 3,911,376 | 10/1975 | Thompson | 357/16 |
| 3,958,263 | 5/1976 | Panish et al. | 357/16 |
| 3,963,538 | 6/1976 | Broadie et al. | 357/16 |
| 3,982,261 | 9/1976 | Antypas | 357/16 |
| 3,995,303 | 11/1976 | Nahory et al. | 357/16 |
| 4,075,651 | 2/1978 | James | 357/16 |
| 4,086,608 | 4/1978 | Clawson et al. | 357/16 |
| 4,186,407 | 1/1980 | Delagebeaudeuf et al. | 357/61 |

FOREIGN PATENT DOCUMENTS 2406895 6/1979 France .................. 357/16

Primary Examiner—William D. Larkins
Attorney, Agent, or Firm—Oblon, Fisher, Spivak, McClelland & Maier

[57] ABSTRACT

A heterojunction semiconductor device comprising an active zone made from a ternary or quaternary alloy of the Ga In As P type and resting via a buffer layer of similar composition on a substrate in such a way that the active layer and the buffer zone have similar expansion coefficients.

1 Claim, 2 Drawing Figures

HETEROJUNCTION SEMICONDUCTOR DEVICE

BACKGROUND OF THE INVENTION

The invention relates to a heterojunction semiconductor device. The term heterojunction semiconductor device is understood to mean a device having a substrate on which have been formed layers of different compositions, usually by epitaxy. Such devices are well known in the art and the substrates are generally formed from the alloy GaAs (gallium arsenide) or InP (indium phosphide), whilst the active layers, i.e. those which directly contribute to the operation of the device are generally formed by ternary or quaternary mixtures comprising incorporated elements (doping agents).

This is the case in particular with electroluminescent diodes, photodetecting diodes and field effect transistors of the MESFET type (metal semiconductor field effect transistor of the Schottky type) comprising active zones which are the seat of light emission and the absorption of photons and where the conductive channel is formed in the case of MESFET.

In the case of electroluminescent diodes, for example of the laser type the active zone must be surrounded by two layers having a forbidden band width greater than that of the active zone.

Generally liquid phase epitaxy is used for producing such structures. However, liquid phase epitaxy is performed at temperatures of 500° to 1000° C. Consequently although the adaptation of the crystalline meshes conveniently takes place at the epitaxial temperature, this is not always the case at the operating temperature, because the thermal expansion coefficients are not always the same in different materials, which leads to disadvantages, particularly in the case of thermal shocks.

BRIEF SUMMARY OF THE INVENTION

The invention aims at obviating these disadvantages.

The invention therefore relates to a heterojunction semiconductor device comprising a substrate constituted by a first semiconductor material having a first expansion coefficient and, deposited by epitaxy on the substrate, at least a first and a second layer of a second semiconductor material of a ternary or quaternary type having a crystalline mesh of approximately the same size as the crystalline mesh of the substrate material and having an expansion coefficient which varies with the composition of the second material, wherein the compositions of the first and second layers are selected in such a way that the expansion coefficient of the first layer is intermediate between the expansion coefficients of the substrate and the second layer.

Another feature of the invention relates to a heterojunction semiconductor device comprising a substrate constituted by a first semiconductor material and, deposited by successive epitaxial processes on the substrate, a buffer layer and at least one active layer constituted by a second semiconductor material with a ternary or quaternary composition, wherein the buffer layer is constituted by the same material as the active layer and from which it only differs by its doping.

BRIEF DESCRIPTION OF THE DRAWING

The invention is described in greater detail hereinafter relative to non-limitative embodiments and the attached drawings, wherein show.

DETAILED DESCRIPTION OF THE PREFERRED EMBODIMENTS

Figure 1:
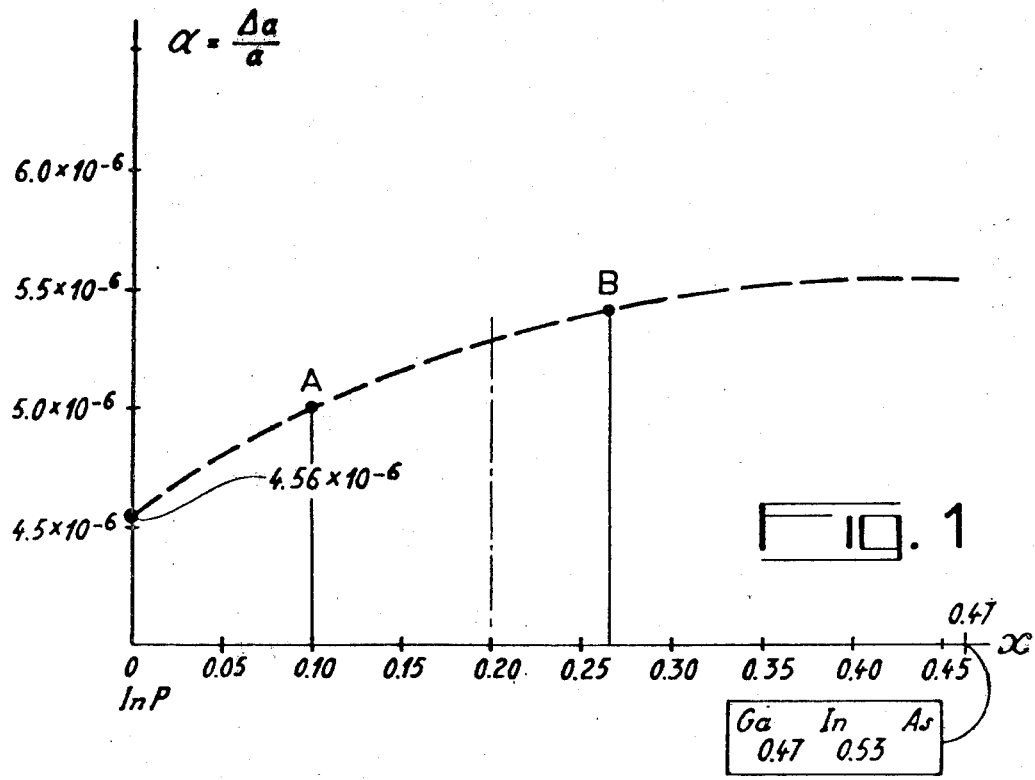
FIG. 1, an explanatory graph.

FIG. 1 shows the thermal expansion coefficient $\alpha$ of an alloy of formula:

$$Ga_xIn_{1-x}As_6P_{1-y}$$

as a function of x, with x varying between 0 and 0.47, the relationship y/x being constant and substantially equal to 2.2. On the ordinate is plotted the coefficient $\alpha$, giving:

$$\alpha = (\Delta a/a)$$

a being the size of a crystal mesh. It should be noted that the gradient of the curve is high when x is between 0 and 0.25 approximately and low when x is between 0.35 and 0.47.

It is known that by liquid phase epitaxy a quaternary mixture of type $Ga_xIn_{1-x}As_yP_{1-y}$ can be grown on an indium phosphide substrate, this operation being performed at a temperature of about 600° C. As a result if there is a good mesh matching 600° C. this will disappear at ambient temperature which is generally the temperature at which the semiconductor is used. Thus, for InP the expansion coefficient is $4,5 \cdot 10^{-6}$ and for $x = 0.25$ that of the quaternary material exceeds $5 \cdot 10^{-6}$. However, the latter varies slightly for $0.30 < x < 0.47$. Thus, there are constraints at ambient temperature between a layer having a parameter x close to 0.45 and an indium phosphide layer, which reduces the reliability of the device.

Figure 2:
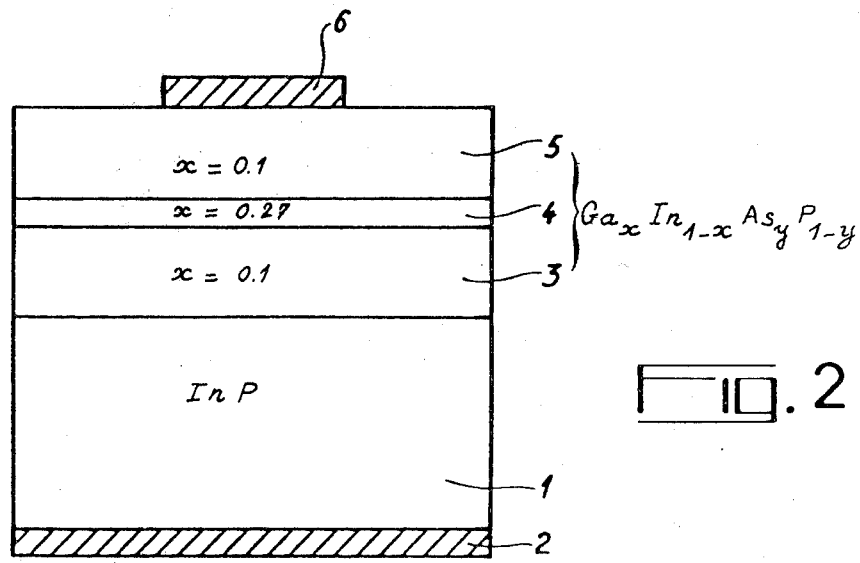
FIG. 2, a longitudinal sectional view of an embodiment of the invention.

A first embodiment is shown in FIG. 2 which is a cross-section of a photoluminescent diode of the laser type along the longitudinal axis of its cavity resonator.

It comprises an indium phosphide substrate 1 on the lower face of which is placed an ohmic contact 2. This substrate of the n+ conductivity-type with a doping of the order of $10^{19}$ at/cm$^3$ has a thickness of 10 to 100 μm. A first layer 3 of formula $Ga_{x3}In_{1-x3}As_{y3}P_{1-y3}$ of thickness 1 to 10 μm is deposited on this substrate. On layer 3 is deposited active layer 4 having a thickness of only 0.1 to 1 μm of the same quaternary alloy of type $Ga_{x4}In_{1-x4}As_{y4}P_{1-y4}$.

Finally layer 4 is surmounted by a layer 5, which is identical to layer 3 and by an ohmic contact 6. Layers 3 and 5 have opposite conductivity types (n and p), whilst the conductivity type of the active zone can be n or p.

The parameters $x_3$ and $x_4$, $y_3$ and $y_4$ are selected in the following manner. Two conditions must be fulfilled at the same time:

(a) The compositions of the semiconductor materials must be such that the forbidden band width of the intermediate layer 4 is smaller than the forbidden band width of layers 3 and 5 which surround it, this being necessary for laser diode operation.

(b) Assuming a position on the graph of FIG. 1 at two points A and B of abscissas $x_3$ and $x_4$ such that the expansion coefficient relative to point A is between the expansion coefficient of InP, i.e. the ordinate at the origin of the curve and the expansion coefficient of the material of layer 4, i.e. the ordinate of B.

A first compromise consists of choosing:
on the one hand for layers 3 and 5:

$0.05 \leq x_3 \leq 0.15$ with $2x_3 \leq y_3 \leq 2.4x_3$
i.e. approx. $0.1 \leq y_3 \leq 1.6$
on the other hand for layer 4:
$0.20 \leq x_4 \leq 0.35$ with $2x_4 \leq y_4 \leq 2.4x_4$
i.e. approx. $0.4 \leq y_4 \leq 0.8$.

A tighter compromise consists of choosing:
$x_3 = 0.1$ with $y_3 = 0.22$
$x_4 = 0.27$ with $y_4 = 0.59$ In the latter case a laser diode is obtained which emits over a wavelength close to 1.3 micron (infrared).

The invention is not limited to the embodiments described and represented hereinbefore and various modifications can be made thereto without passing beyond the scope of the invention.

What is claimed is:

1. A heterojunction semiconductor device, capable of operating as an electroluminescent diode, comprising:

a substrate made of indium phosphide;
a first layer deposited on said substrate, said layer having a composition responding to the formula:

$$Ga_{x_3}In_{1-x_3}As_{y_3}P_{1-y_3}$$

a second layer deposited on said first layer, said second layer having a composition responding to the formula:

$$Ga_{x_4}In_{1-x_4}As_{y_4}P_{1-y_4}$$

and
a third layer deposited on said second layer and of the same composition as said first layer wherein the width of the second layer is less than the width of the first or third layer and $x_3 = 0.1$; $y_3 = 0.22$; $x_4 = 0.27$ and $y_4 = 0.59$.

* * * * *